United States Patent
Linn et al.

(10) Patent No.: US 6,909,146 B1
(45) Date of Patent: Jun. 21, 2005

(54) BONDED WAFER WITH METAL SILICIDATION

(75) Inventors: Jack H. Linn, Melbourne, FL (US); Robert K. Lowry, Melbourne Beach, FL (US); George V. Rouse, Indiatlantic, FL (US); James F. Buller, Indiatlantic, FL (US)

(73) Assignee: Intersil Corporation, Palm Bay, FL (US)

( * ) Notice: Subject to any disclaimer, the term of this patent is extended or adjusted under 35 U.S.C. 154(b) by 1210 days.

(21) Appl. No.: 09/316,580

(22) Filed: May 21, 1999

Related U.S. Application Data

(63) Continuation of application No. 08/915,841, filed on Aug. 21, 1997, now abandoned, which is a continuation of application No. 08/681,038, filed on Jul. 22, 1996, now abandoned, and a continuation of application No. 08/430,312, filed on Apr. 28, 1995, now Pat. No. 5,849,627, which is a division of application No. 08/351,933, filed on Dec. 8, 1994, now Pat. No. 5,569,620, which is a continuation of application No. 07/939,786, filed on Sep. 3, 1992, now Pat. No. 5,387,555, and a continuation of application No. 07/921,197, filed on Jul. 28, 1992, now Pat. No. 5,362,667, and a continuation of application No. 07/834,439, filed on Feb. 12, 1992, now Pat. No. 5,266,135.

(51) Int. Cl.$^7$ .......................... H01L 27/01; H01L 27/12; H01L 31/0392; H01L 29/00
(52) U.S. Cl. ..................... 257/347; 257/350; 257/351; 257/537
(58) Field of Search ................................ 257/347, 350, 257/351, 537, 204

(56) References Cited

U.S. PATENT DOCUMENTS

| | | | |
|---|---|---|---|
| 2,974,075 A | 3/1961 | Miller | |
| 3,239,908 A | 3/1966 | Nakamura | |

(Continued)

FOREIGN PATENT DOCUMENTS

| | | |
|---|---|---|
| EP | 0 238 066 | 9/1987 |
| EP | 0 441 270 A3 | 8/1991 |

(Continued)

OTHER PUBLICATIONS

M. Shimbo, et al., "Silicon–to–Silicon Direct Bonding Method", *Journal of Applied Physics.*, vol. 60(8), pp. 2987–2989, (Oct. 1986).

(Continued)

*Primary Examiner*—Steven Loke
(74) *Attorney, Agent, or Firm*—Fogg and Associates, LLC; Scott V. Lundberg

(57) ABSTRACT

A silicon-on-insulator integrated circuit comprises a handle die, a substantially continuous and unbroken silicide layer over the handle die, and a substantially continuous and unbroken first dielectric layer overlying one side of the silicide layer. A device silicon layer having an upper surface overlies the first dielectric layer, and a second dielectric layer on the handle die underlies the opposite side of the silicide layer. Interconnected transistors are disposed in and at the upper surface of the device silicon layer. A silicon-on insulator integrated circuit includes a handle die and a first dielectric layer formed on the handle die. A substantially continuous and unbroken silicide layer is formed on the first dielectric layer; the silicide layer has a controlled resistance and provides a diffusion barrier to impurities. A substantially continuous and unbroken second dielectric layer is disposed between the silicide layer and a device silicon layer, and trenches extend through the device silicon layer and silicide layer and separate the device silicon layer into islands, each having an underlying continuous silicide area. Interconnected transistors are disposed in and at an upper surface of the device silicon layer. A bonded wafer integrated circuit comprised a handle die and a homogeneous silicide layer bonded to the handle die. A device layer is bonded to the silicide layer, and interconnected transistors are disposed in and at a surface of device layer.

6 Claims, 8 Drawing Sheets

U.S. PATENT DOCUMENTS

| | | | |
|---|---|---|---|
| 3,689,357 A | | 9/1972 | Jordan |
| 4,638,552 A | | 1/1987 | Shimbo et al. |
| 4,738,935 A | | 4/1988 | Shimbo et al. |
| 4,826,787 A | | 5/1989 | Muto et al. |
| 4,854,986 A | | 8/1989 | Raby |
| 4,878,957 A | | 11/1989 | Yamaguchi et al. |
| 4,883,215 A | | 11/1989 | Goesele et al. |
| 4,962,062 A | | 10/1990 | Uchiuyama et al. |
| 4,980,306 A | | 12/1990 | Shimbo |
| 5,098,861 A | | 3/1992 | Blackstone |
| 5,102,821 A | * | 4/1992 | Moslehi ............... 437/62 |
| 5,131,968 A | | 7/1992 | Wells et al. |
| 5,168,078 A | | 12/1992 | Reisman et al. |
| 5,169,472 A | | 12/1992 | Goebel |
| 5,183,769 A | | 2/1993 | Rutter et al. |
| 5,212,397 A | * | 5/1993 | See et al. ............ 257/347 |
| 5,266,135 A | | 11/1993 | Short et al. |
| 5,362,667 A | | 11/1994 | Linn et al. |
| 5,378,919 A | * | 1/1995 | Ochiai .............. 257/204 |
| 5,387,555 A | | 2/1995 | Linn et al. |

FOREIGN PATENT DOCUMENTS

| | | | | |
|---|---|---|---|---|
| EP | 0 256 397 | | 2/1998 | |
| GB | 2 242 313 | | 9/1991 | |
| JP | 62-2122-148 | | 6/1987 | |
| JP | 1-73659 | * | 3/1989 | ............ 257/537 |
| JP | 2-18961 | * | 1/1990 | ............ 257/347 |
| JP | 2-148821 | | 6/1990 | |
| JP | 2-206118 | * | 8/1990 | ............ 257/347 |

OTHER PUBLICATIONS

Wolf, et al., "Silicon Processing for the VLSI Era", *Lattice Press*, vol. 1., pp. 390–391, 1986.

Sorab K. Ghandi, "Silicides", VLSI Fabrication Principles, *John Wiley & Sons*, pp. 435–437, 1983.

S.P. Murarka, "Refractory Silicides For Integrated Circuits", *J. Vac. Science Technology*, vol. 17(4), pp. 775–792, (Jul./Aug. 1980).

Toshiba KK, "Bonding Method for Semiconductor Wafer", *Patent Abstracts*, vol. 9, No. 227 E–355, A 60121715, Jun. 11, 1985, Japan.

Fukuroda, et al., "Si Wafer Bonding with Ta Silicide Formation", *Japanese Journal of Applied Physics*, vol. 30, No. 10A, pp. 1693–1695, (Oct. 1, 1991), Tokyo, Japan.

Muller and Stoffel, "Tensile Strength Characterization of Low–Temperature Fusion–Bonded Silicon Wafers", *Journal of Micromechanics & Microengineering*, vol. 1, No. 3, pp. 161–166, (1991), New York.

Astrova, et al., "The Nature of the P–Type Layer Formed in the Interface Region of Semiconducting Wafers During Solid–Phase Direct Bonding of Silicon", A.F. Ioffe Physicotechnical Institute, *Russian Academy of Sciences*, pp. 457–458, (Jul. 18, 1992), New York.

Imthurn et al., "Bonded Silicon–On–Sapphire Wafers and Devices", *Journal of Applied Physics*, vol. 72, No. 6, pp. 2526–2527, (Sep. 15, 1992), New York.

Godbey, et al., "Fabrication of Bond and Etch–Back Silicon On Insulator Using Strained Si. sub 0.7 Ge, sub 0.3 Layer as An Eth Stop", *Journal of Electrochemical Society*, vol. 137, No. 10. pp. 3219–3223, (Oct. 1990), New Hampshire.

J. Lasky, et al., "Silicon–On Insulator (SOI) By Bonding and Etch–Back", *1985 IEDM Tech., Dig.*, vol. 85, pp. 684–687.

Spierings and Haisma, "Diversity and Interfacial Phenomena in Direct Bonding", An Overview, Proceedings First International Symposium on Semiconductor Wafer Bonding, *Electrochemical Society Meeting*, pp. 18–32, (Oct. 1991), Phoenix, Arizonia.

Maszara, "Semiconductor Wafer Bonding: An Overview, Proceedings of First International Symposium on Semiconductor Wafer Bonding", Science Technology & Applications, *Electrochemical Society Meeting*, pp. 3–17, (Oct. 1991), Phoenix, Arizonia.

J. Haisma, et al. "Silicon On–Insulator Wafer Bonding Wafer Thinning Evaluations", *Japanese Journal Appl. Phys.*, vol. 28, No. 8, pp. 1426–1443, (1989).

**The above cited references were included with prior filed IDS's for application Nos. 08/915,841, 08/681,038, 08/351, 933, 07/939,786, 07/834,439, 07/921,197, 08/430,312.

* cited by examiner

BONDED WAFER WITH METAL SILICIDATION

CROSS-REFERENCE TO RELATED APPLICATIONS

This application is a continuation of U.S. application Ser. No. 08/915,841, filed Aug. 21, 1997, now abandoned; which is a continuation of U.S. application Ser. No. 08/681,038, filed Jul. 22, 1996, now abandoned; which is a division of U.S. application Ser. No. 08/351,933, filed Dec. 8, 1994, now U.S. Pat. No. 5,569,620; which is a continuation of U.S. application Ser. No. 07/939,786, filed Sep. 3, 1992, now U.S. Pat. No. 5,387,555, the disclosures of which are incorporated herein by reference.

This application is also a continuation of U.S. application Ser. No. 07/834,439, filed Feb. 12, 1992, now U.S. Pat. No. 5,266,135; U.S. application Ser. No. 07/921,197, filed Jul. 28, 1992, now U.S. Pat. No. 5,362,667; and U.S. application Ser. No. 08/430,312, filed Apr. 28, 1995, now U.S. Pat. No. 5,849,627, the disclosures of which are incorporated herein by reference.

FIELD OF THE INVENTION

The present invention relates to electronic integrated circuits and methods of fabrication, and, more particularly, to dielectrically isolated semiconductor integrated circuits and related fabrication methods.

BACKGROUND OF THE INVENTION

Integrated circuits fabricated in silicon-on-insulator substrates offer performance advantages including freedom from latchup for CMOS structures, high packing density, low parasitic capacitance, low power consumption, radiation hardness, high voltage operation, and the possibility of three dimensional integration. Indeed, isolation trenches extending through the silicon layer down to the insulation provide a simple approach to dielectric isolation of integrated circuit devices. The sidewalls of such trenches are coated with an insulator, usually silicon dioxide, and the remaining portion of trench opening, if any, is filled with a filler, usually polycrystalline silicon. Diffused PN junctions can also be used for lateral isolation.

Additionally, silicon-on-insulator technology using very thin films offers special advantages for submicron devices. Scaling bulk devices tends to degrade their characteristics because of small-geometry effects such as punch-through, threshold voltage shift, and subthreshold-slope degradation. The use of silicon-on-insulator devices suppresses these small-geometry effects. Therefore, even in the submicron VLSI domain, silicon-on-insulator technology can offer even higher device performance over bulk technology, along with the inherent advantages of silicon-on-insulator.

Silicon-on-insulator substrates may be fabricated in various ways: a crystalline silicon layer may be formed over an existing oxide layer either by laser or strip heater recrystallization of polysilicon deposited on the oxide, or by selective epitaxial silicon growth over the oxide. However, the quality of such a silicon layer is generally inferior to that normally associated with bulk silicon. Other approaches entail forming an oxide layer beneath an existing high quality silicon layer, either by oxidizing a buried porous silicon layer or by oxygen ion implantation; however, such oxide is low quality, and the silicon top layer may be damaged during the oxide layer formation.

Another approach to silicon-on-insulator is wafer bonding, as described by J. Lasky et al., "Silicon-On-Insulator (SOI) by Bonding and Etch-Back," 1985, IEDM Tech. Deg., 684. This wafer bonding process proceeds as follows: a lightly doped epitaxial layer of silicon is grown on a heavily doped silicon substrate, oxide is thermally grown on the epitaxial layer, a second lightly doped silicon substrate is thermally oxidized, and the two oxidized surfaces are pressed together. See FIG. 1a. The pressed together wafers are inserted into an oxidizing atmosphere at 1100° C. to bond them, as illustrated in FIG. 1b. Lastly, a preferential etch is used to remove the heavily doped substrate, leaving the thin, lightly doped epitaxial layer above the bonded thermally grown oxides, which are now on the second substrate, as shown in FIG. 1c. The resulting thin silicon layer above the thermally grown oxide is of high quality; the oxide also retains its quality and may be either thick, as might be desired for CMOS or high voltage devices, or thin, as might be desired for shared element applications. FIG. 1d heuristically illustrates trench isolation with polysilicon-filled trenches isolating MOSFET and bipolar devices.

Conceptually, this process may meet all the desired goals for the ultimate silicon-on-insulator material: a specular finished crystalline silicon layer without dislocations and a back interface with the insulator of quality equal to the interface of thermally grown silicon dioxide on silicon, both the crystalline silicon layer and the insulator being of variable thickness.

Another wafer bonding method, illustrated in FIGS. 2a–c and described in U.S. Pat. No. 5,362,667, proceeds as follows: Beginning with a device wafer having a lightly doped epitaxial layer on a heavily doped substrate and a handle wafer with a thick (4,000 Å) oxide layer, activate the device wafer surface with an acid or peroxide wash to enhance hydroxyl group formation. Place a drop of oxidant such as water plus hydrogen peroxide on the oxide, and squeeze the wafers together. See FIG. 2a. The drop of oxidant has a volume in the range of 0.8 to 8.0 microliters per square inch of wafer surface. After drying the squeezed wafers at room temperature for a day, heat them to 1150° C. for two hours, which causes oxidation of the device wafer and formation of silicon-oxygen bonds to fuse the wafers. See FIG. 2b. Lastly, grind and etch the device wafer to expose the epitaxial layer, which completes the silicon-on-insulator substrate, as shown in FIG. 2c. For applications that require a thick (10–60 $\mu$m) silicon-on-insulator layer and a thicker (e.g., 4 $\mu$m) bottom oxide but allow some tolerance in the layer thickness, a slightly simpler process, where a uniformly lightly doped device wafer is thinned by grinding and polishing, can be used.

Bonded wafers, however, have problems of high temperature bonding that lead to film stress and delamination. Also, because oxides are poor diffusion barriers to mobile ions such as sodium, bonded wafers with silicon dioxide buried layers are susceptible to contaminant diffusion. Contaminants introduced during the bonding process can easily diffuse to the device layer interface, resulting in electrical instability.

SUMMARY OF THE INVENTION

The present invention is directed to a silicon-on-insulator integrated circuit that comprises a handle die, a substantially continuous and unbroken silicide layer over the handle die, and a substantially continuous and unbroken first dielectric layer overlying one side of the silicide layer. A device silicon layer having an upper surface overlies the first dielectric layer, and a second dielectric layer on the handle die underlies the opposite side of the silicide layer. Interconnected transistors are disposed in and at the upper surface of the device silicon layer.

Also in accordance with the present invention is a silicon-on-insulator integrated circuit that includes a handle die and a first dielectric layer formed on the handle die. A substantially continuous and unbroken silicide layer is formed on the first dielectric layer; the silicide layer has a controlled resistance and provides a diffusion barrier to impurities. A substantially continuous and unbroken second dielectric layer is disposed between the silicide layer and a device silicon layer, and trenches extend through the device silicon layer and silicon layer and separate the device silicon layer into islands, each having an underlying continuous silicide area. Interconnected transistors are disposed in and at an upper surface of the device silicon layer.

The present invention is further directed to a bonded wafer integrated circuit that comprises a handle die and a homogeneous silicide layer bonded to the handle die. A device layer is bonded to the silicide layer, and interconnected transistors are disposed in and at a surface of device layer.

The present invention provides silicon-on-insulator bonded wafer processing with the features of (1) relatively low temperature bonding by the use of low temperature, about 500–800° C. metal silicidation reactions for bonding; (2) better stress compensation by providing materials in the bonding zone that will produce silicides with coefficients of thermal expansion closely matched to those of the substrate wafers and buried dielectric layers, thereby reducing warpage; (3) limiting contaminant migration by means of a bonding zone that provides a barrier to diffusion of mobile contaminants; (4) simultaneously producing a buried doped layer in the silicon during the bonding process; (5) a conductive, dielectrically-isolated layer at the bonding zone; and (6) a thermally conductive layer at the bonding zone.

DETAILED DESCRIPTION OF THE INVENTION

Silicidation Bonding

Figure 1A:
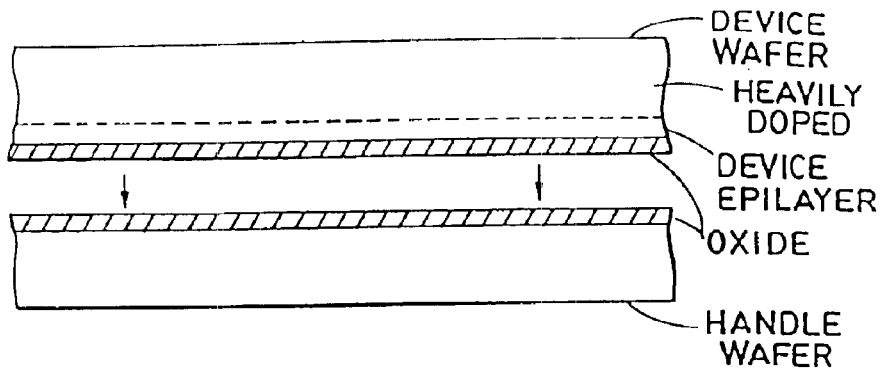
FIGS. 1a–d illustrate in cross-sectional elevation views known wafer bonding methods.
Figure 1B:
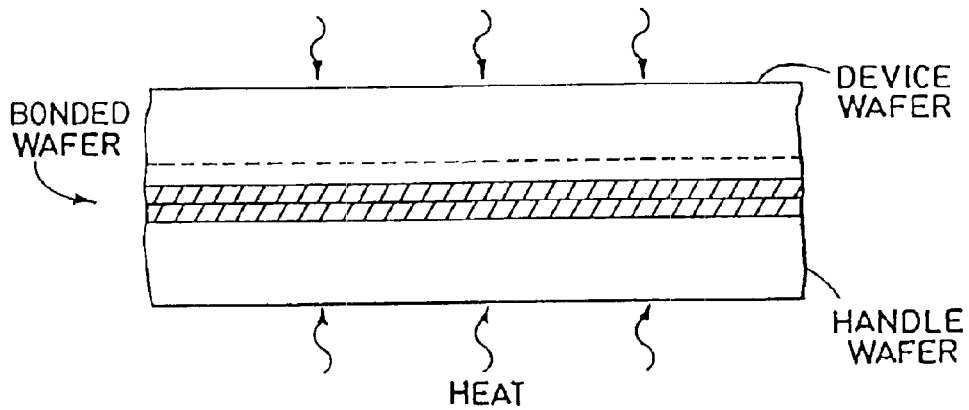
Figure 1C:
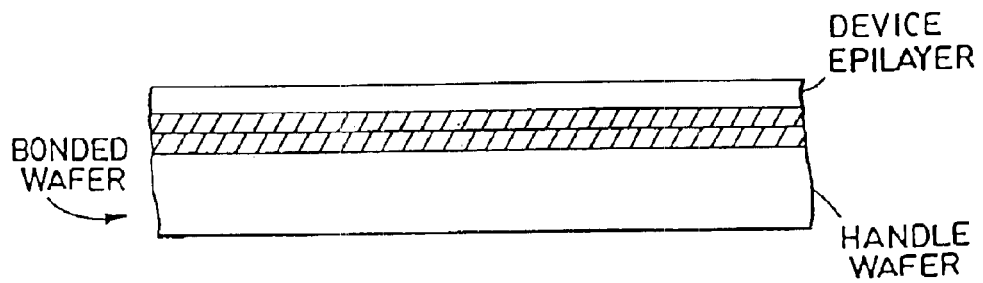
Figure 1D:
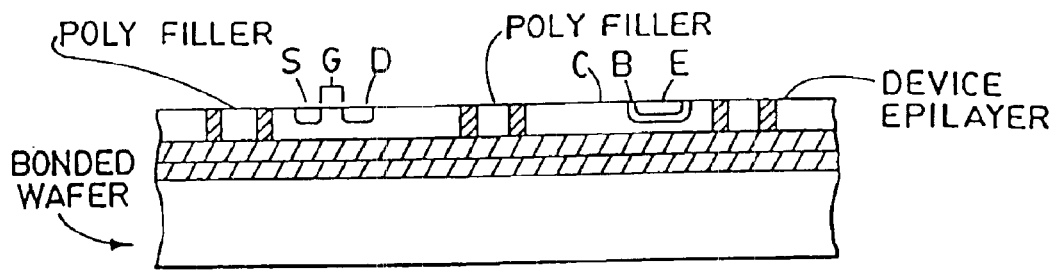

FIGS. 3a–f illustrate in cross-sectional elevation view a first preferred embodiment method of silicon-on-insulator bonded wafer processing.

(a) Begin with a four-inch diameter 500 μm-thick silicon device wafer 302 and a comparable diameter 500-μm thick silicon handle wafer 312. Device wafer 302 has the doping type and resistivity (e.g., N type and 20 ohm-cm resistivity) desired for eventual device fabrication. Thermally oxidize device wafer 302 to form oxide layer 316. Oxide 316 will become the bottom oxide, so the oxide is grown to the desired bottom oxide thickness, e.g., about 2–4 μm. Alternatively, diamond or silicon nitride ("nitride") can be deposited on device wafer 302 to form the buried dielectric layer 316. A diamond thin film 316 can be deposited by a chemical vapor deposition (CVD) reaction of methane and hydrogen, and a nitride thin film can be deposited by decomposition of silane and ammonia.

Deposit a 500-angstrom thick polysilicon layer 317 on oxide (or other dielectric) 316, or deposit a thicker polysilicon layer and polish it down to 500 angstroms. Then deposit a 500–1000- angstrom thick layer platinum 318 on polysilicon 317; see FIG. 3a. The polysilicon layer can be deposited by silane decomposition, the platinum layer by sputtering. Handle wafer 312 only has native oxide on its surfaces.

Figure 2A:
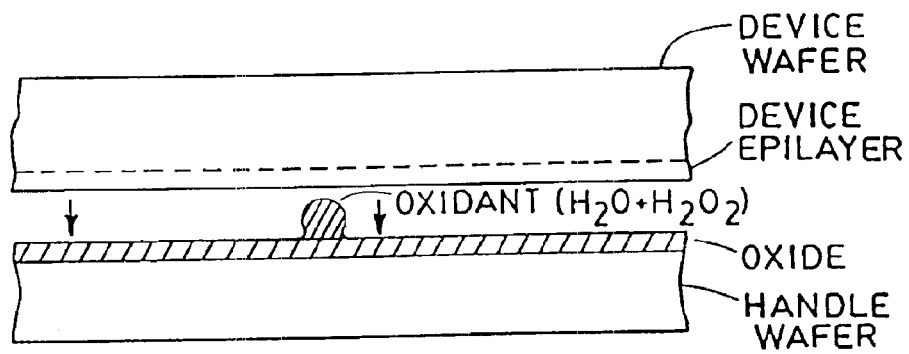
FIGS. 2a–c illustrate in cross-sectional elevation views a further wafer bonding method.
Figure 2B:
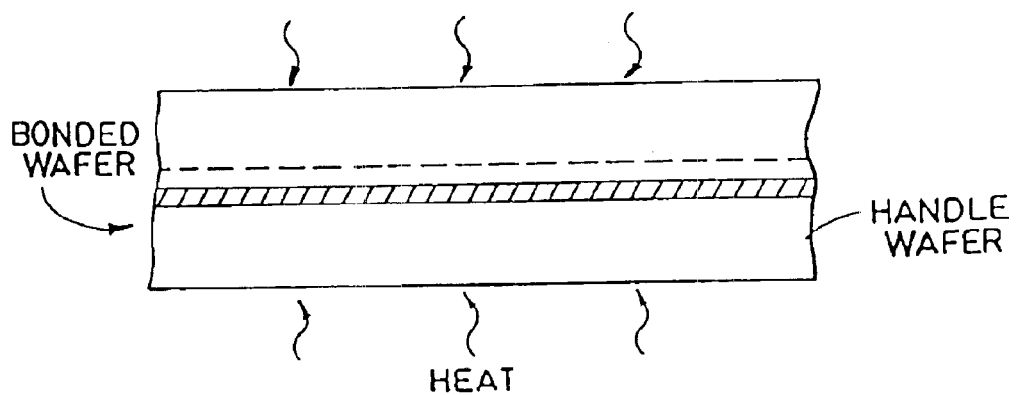
Figure 2C:
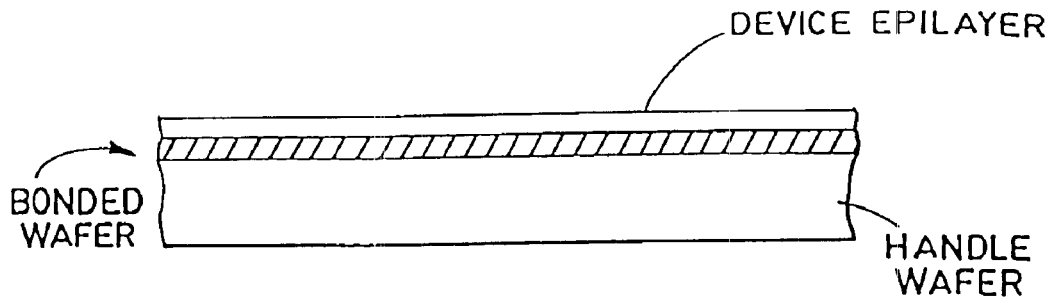
Figure 3A:
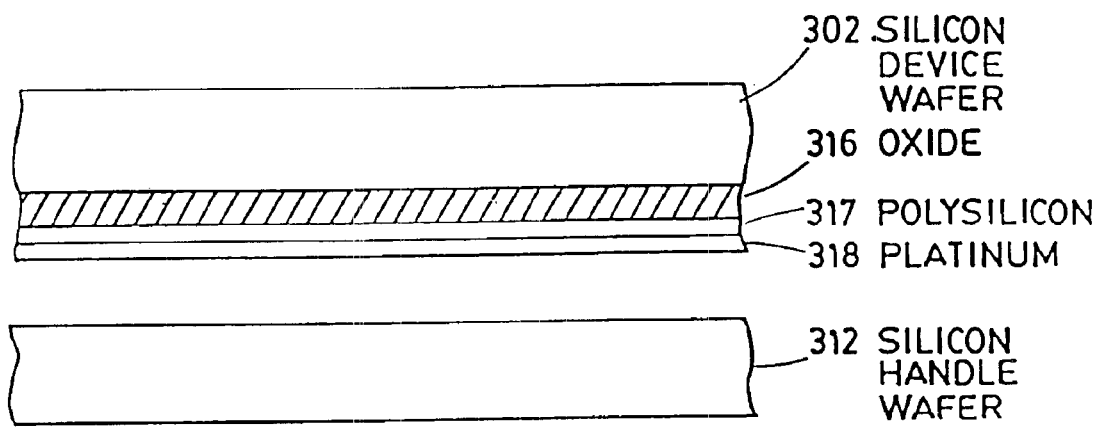
FIGS. 3a–g are cross-sectional elevation views of a first preferred embodiment of a wafer bonding method of the present invention.
Figure 3B:
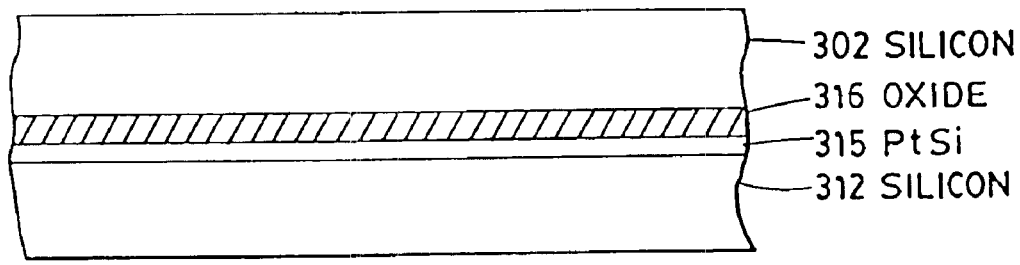
Figure 3C:
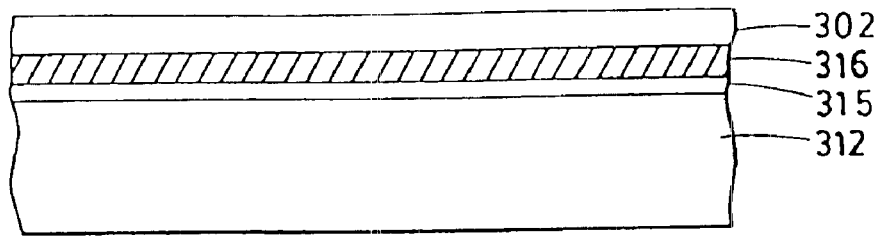
Figure 3D:
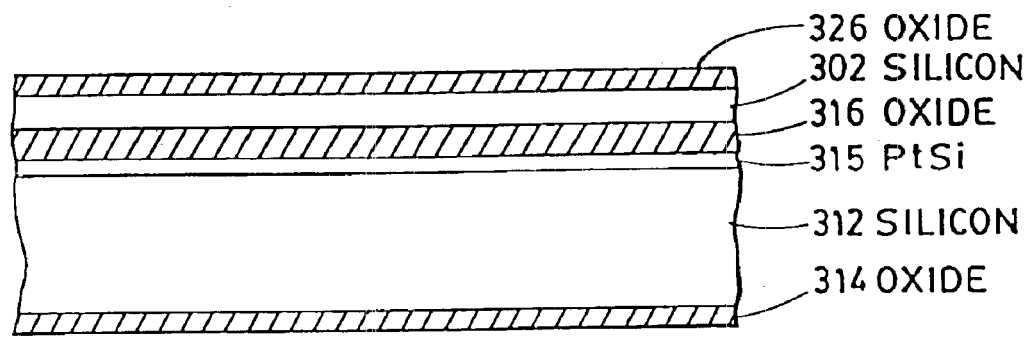
Figure 3E:
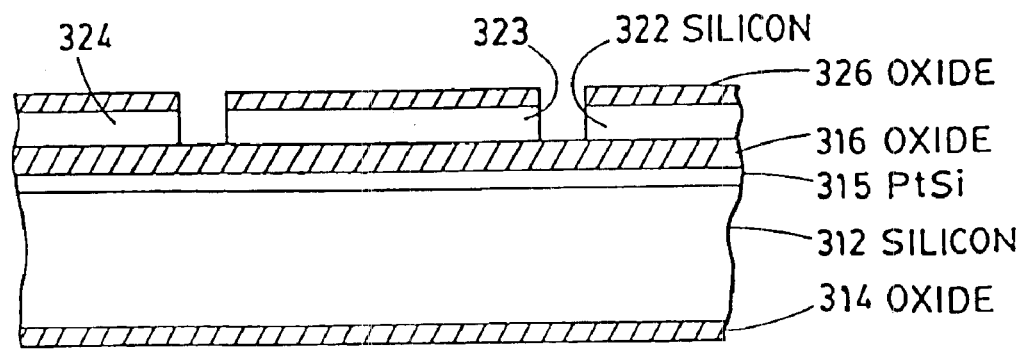
Figure 3F:
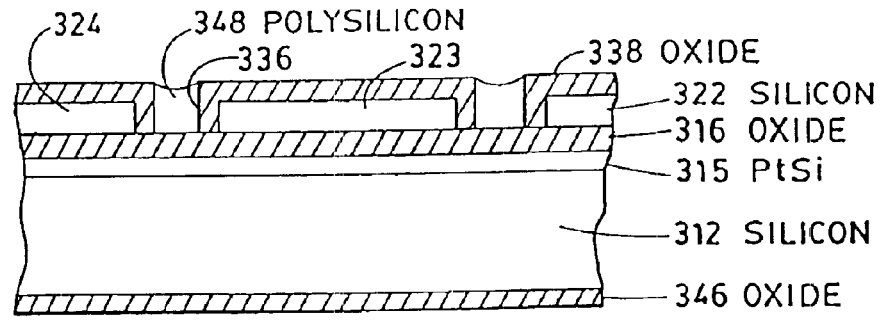

(b) Press handle wafer 312 and device wafer 302 together, and heat them to 500° C. in a 2–6 hour furnace cycle with a nitrogen or forming gas ambient. This drives platinum 318 to react with silicon 312 and polysilicon 317 to form platinum silicide, PtSi and thereby bind the wafers together. Native oxide on handle wafer 312 dissolves in the PtSi and does not prevent the silicidation. This low temperature bonding depends upon the silicidation reaction and not on thermal oxidation as in the process depicted in FIGS. 2a–c. See FIG. 3b showing PtSi layer 315. The platinum forms silicon-platinum bonds with both device wafer silicon 312 and polysilicon 317. The deposition of polysilicon 317 on oxide (or other dielectric) 316 had previously formed silicon-oxygen (or silicon-carbon or silicon-nitrogen) bonds and bound polysilicon 317 to oxide (dielectric) 316. The silicidation of polysilicon 317 retains these silicon bonds and thus binds device wafer 302 to handle wafer 312 through silicon/silicide and silicide/dielectric interfaces. The silicon-platinum bond-forming reaction basically is:

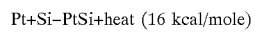

Pt+Si–PtSi+heat (16 kcal/mole)

Bonded zone PtSi 315 has a thickness of approximately 600–1000 angstroms.

(c) After bonding, remove the bulk of device wafer 302 by grinding, lapping, and polishing to leave the desired device island thickness, e.g., 35–40 μm. This thinning of device wafer 302 proceeds without any etch stop, so the final thickness of device wafer 302 depends upon process control. See FIG. 3c. The use of an etch stop permits much smaller device island thicknesses, e.g., about 1 μm.

(d) Deposit mask oxide 326 on device wafer 302 to a thickness of about 4 μm. PtSi is stable up to 550° C., so thermal oxidation cannot be used. However, other refractory metals such as cobalt and nickel form suicides that are stable to above 900° C., so thermal oxidation can be used with bonding by such silicides. Mask oxide 326 is used as a trench etch mask; see FIG. 3d. Thermal oxidation will also grow oxide 314 on the backside of handle wafer 312.

(e) Print a trench pattern into photoresist spun onto mask oxide 326. Note that for thermal oxidation, the bottom oxide (or other dielectric) 316 (4 μm), the mask oxide 326 (4 μm) and the backside oxide 314 (4 μm) are all fairly closely matched in thickness during the photoresist patterning, and bond silicide layer 315 is fairly thin. This provides a rough stress balance and limits warpage of the bonded wafers. Alternatively, with PtSi or other silicide with limited temperature stability and deposited mask oxide, the process temperature cycling has had limited excursions, so warpage is not as great a problem. Use the patterned photoresist as etch mask to wet etch (HF) the trench pattern in oxide 326; then strip the photoresist and use the patterned oxide 326 to plasma reactive ion etch (REIF) device wafer 302 to form silicon islands 322, 323, . . . on oxide layer 316. This etch stops on oxide or other dielectric 316; see FIG. 3e.

(f) Strip patterned oxide 326 with a wet etch, which also removes the remaining backside oxide 314 on the back of handle wafer 312. Then thermally grow or conformally deposit (depending on silicide thermal stability) oxide to a thickness of 4 μm to form isolation oxide 336 on the sides of islands 322,323, . . . This also forms 4 μm of oxide 338 on the island surfaces and 4 μm of backside oxide 346 on handle wafer 312. Next, deposit polysilicon 348 to fill the trenches. Lastly, planarize to remove the polysilicon except from the trenches; see FIG. 3f. Note that again the island surface oxide 338, bottom oxide 316, and backside oxide 346 all have about the same thickness (4 μm), which limits warpage resulting from stress differentials.

Figure 3G:
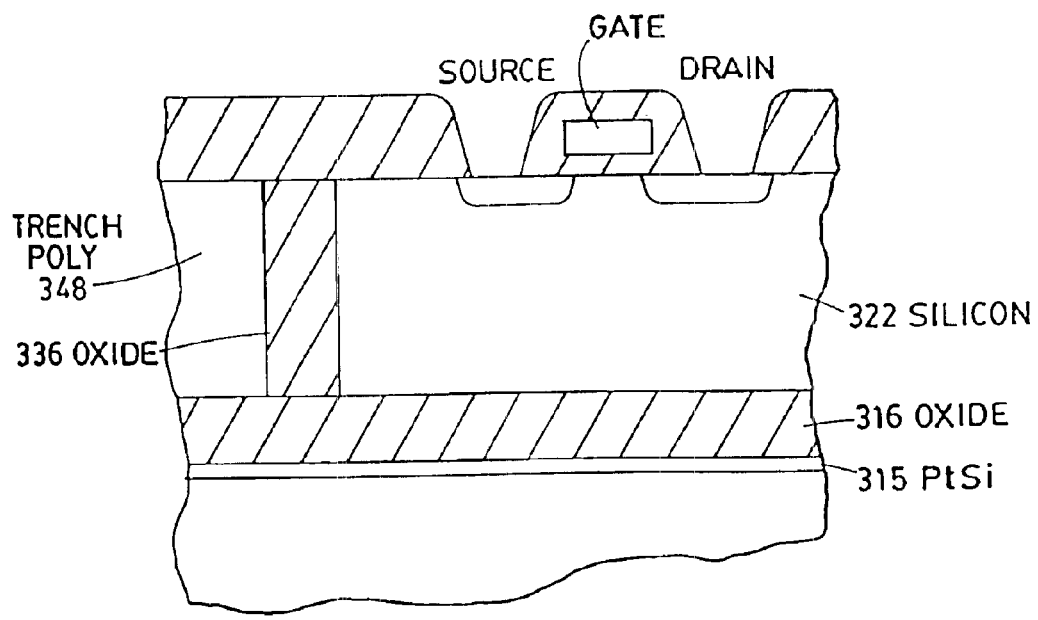

(g) Fabricate devices in the silicon islands. The particular fabrication steps used will depend on the types of devices, interconnection structure, and insulations desired and can include oxide growth and deposition, photoresist patterning, wet and dry etches, diffusions and implants, various material depositions such as polysilicon and nitride, epitaxial layer growth, deposition of various metals such as aluminum and tungsten, and chemomechanical polishing. FIG. 3g schematically shows in expanded cross-sectional elevation view a partially completed MOSFET in island 322, which would be just one of thousands of such devices in an integrated circuit fabricated on the bonded wafer.

An advantage of silicon-on-insulator integrated circuits with devices overlying bottom oxide (or other dielectric) 316 plus bond PtSi (or other silicide) layer 315 rather than just bottom oxide layer 316 alone includes extra charge dissipation along silicide layer 315, better thermal dissipation in the case of diamond films 316 along silicide 315, and a silicide diffusion barrier to prevent contaminants from diffusing upward from the handle wafer or bonding zone. In addition, these integrated circuits can be produced on wafers that have much lower thermal budgets as a result of the low temperature wafer bonding or silicidation. This results in less inherent stress, especially in the case of diamond films 316, and less dopant and contaminant diffusion.

Dielectrically Isolated Silicidation Bonding

Figure 4A:
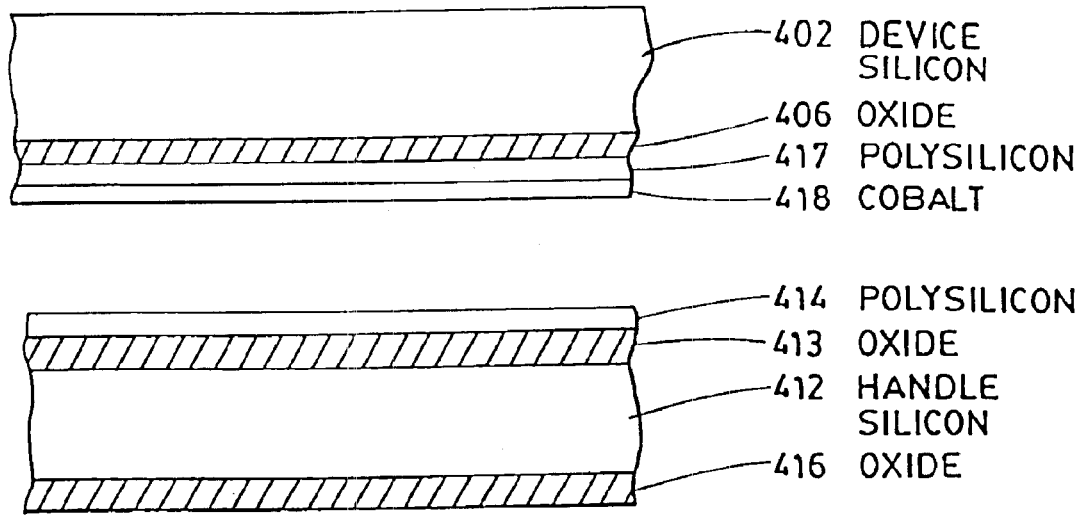
FIGS. 4a–d are cross-sectional elevation views of a second preferred embodiment of a wafer bonding method of the invention.
Figure 4B:
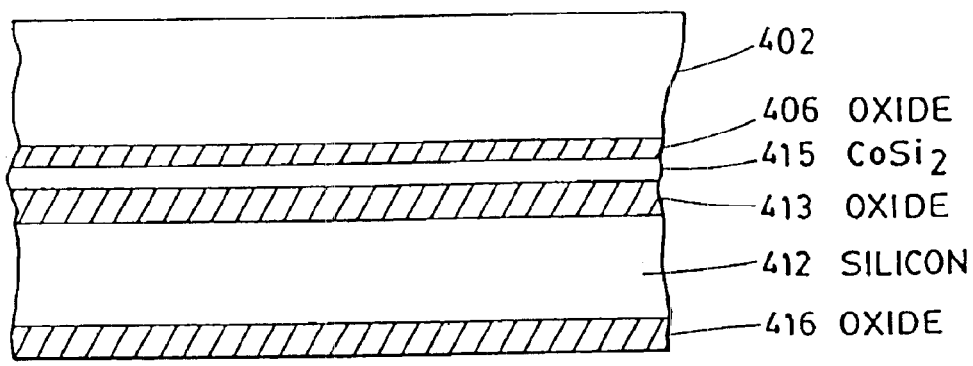
Figure 4C:
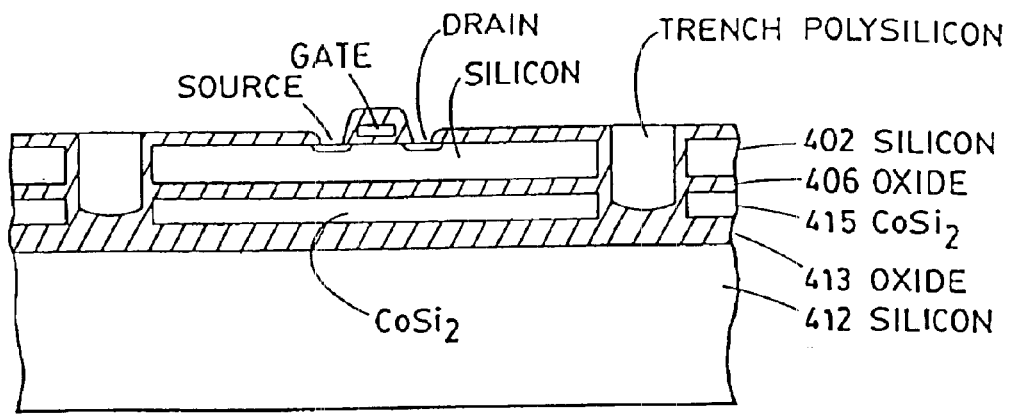

FIGS. 4a–c illustrate in cross-sectional elevation view a second preferred embodiment method of bonded wafer processing.

(a) Begin with a six-inch diameter 600-μm thick silicon device wafer 402 and a comparable diameter 600-μm thick silicon handle wafer 412. Device wafer 402, which has the doping type and resistivity, including any buried layer doping, desired for eventual device fabrication, has a 500-angstrom thick, substantially continuous thermal oxide layer 406, a 500-angstrom thick polysilicon layer 417, and a 1000-angstrom thick cobalt layer 418 on its bonding surface. Thermally oxidize handle wafer 412 to form oxide layers 416 and 413. Oxide 413 will become the bottom oxide, so the oxide is grown to the desired bottom oxide thickness, e.g., 3 μm. Again, alternative bottom dielectrics can be deposited: diamond, nitride, oxynitride, multiple layers of different dielectrics, and so forth. Oxide 416 provides stress compensation to restrain warpage. Deposit a 500-angstrom thick polysilicon layer 414 on oxide (dielectric) 413; see FIG. 4a. The deposition of polysilicon can be by silane decomposition, the deposition of cobalt by sputtering.

(b) Press handle wafer 412 and device wafer 402 together, and heat them to 800° C. in a 2–6 hour furnace cycle with a nitrogen or other inert ambient. This drives cobalt 418 to react with polysilicon 414 and polysilicon 417 to form a substantially continuous layer of cobalt silicide, $CoSi_2$ and thereby bind the wafers together. This low temperature bonding depends upon the silicidation reaction and not on thermal oxidation, as in the process represented by FIGS. 2a–c. See FIG. 4b showing $CoSi_2$ layer 315. The cobalt forms silicon-cobalt bonds with both polysilicon 414 and polysilicon 417. The deposition of polysilicon 417 on oxide 406 had previously formed silicon-oxygen bonds and bound polysilicon 417 to oxide 406; similarly, polysilicon 414 is bound to oxide 413. The silicidation of polysilicon 414 and 417 retains these silicon/oxygen bonds and thus binds device wafer 402 to handle wafer 412 through silicon/oxide and silicide/oxide interfaces. Bonded zone $CoSi_2$ 415 has a thickness of about 600–1000 angstroms. Note that cobalt forms the silicide in preference to reducing the oxide by $SiO_2+Co-Si+CoO_2$.

(c) After bonding, remove the bulk of device wafer 402 by grinding, lapping, and polishing to leave the desired device island thickness, e.g., 20 μm. This thinning of device wafer 402 proceeds as in the first preferred embodiment, as does subsequent device fabrication. Because thermal oxide 406 is quite thin, the trench etch will remove it, and the exposed $CoSi_2$ can then also be removed. Then a trench sidewall oxidation plus conformal oxide deposition will isolate the substantially continuous $CoSi_2$ layer under each silicon island between the trenches; see FIG. 4c.

Figure 4D:
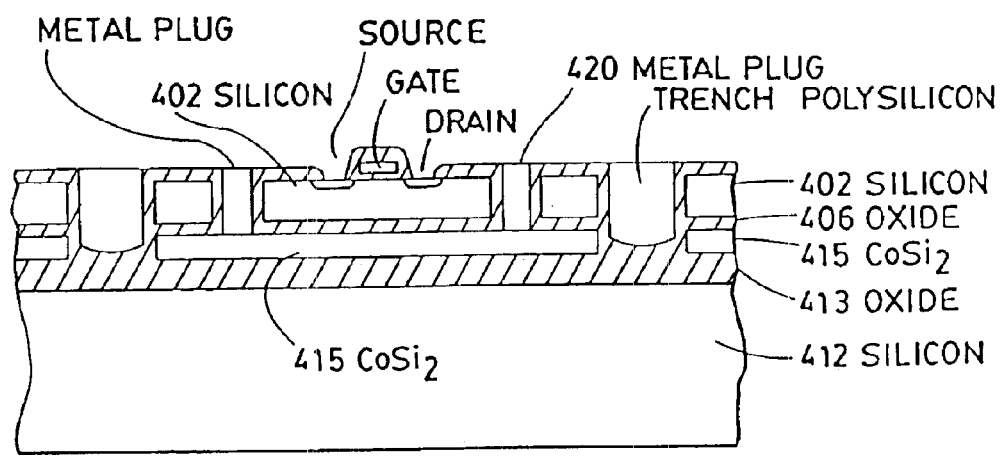

The structure of the second preferred embodiment has the advantage that $CoSi_2$ layer 415 can act both as a resistor under each silicon island and as a diffusion barrier for impurities diffusing out of bottom oxide (dielectric) 413 during processing. Thin thermal oxide 406 provides the electrical isolation of $CoSi_2$ 415 from its silicon island. Such buried resistors help in three-dimensional integration by allowing vertical integration, thus providing smaller die geometries. FIG. 4d illustrates the use of $CoSi_2$ as a resistor stacked directly below the silicon island. In particular, contacts to $CoSi_2$ 415 can be made by another trench etch that stops on the silicide followed by oxidation of trench sidewalls and filling with a metal plug 420 such as tungsten. This resistor contact formation may be most convenient with thin silicon islands; that is, when silicon 402 is about 2 μm or less in thickness. The resistance of such resistors can be adjusted by varying the silicide thickness/composition or silicon island size. The structure illustrated in FIG. 4d shows a single transistor.

Silicidation Plus Oxidation Bonding

Figure 5A:
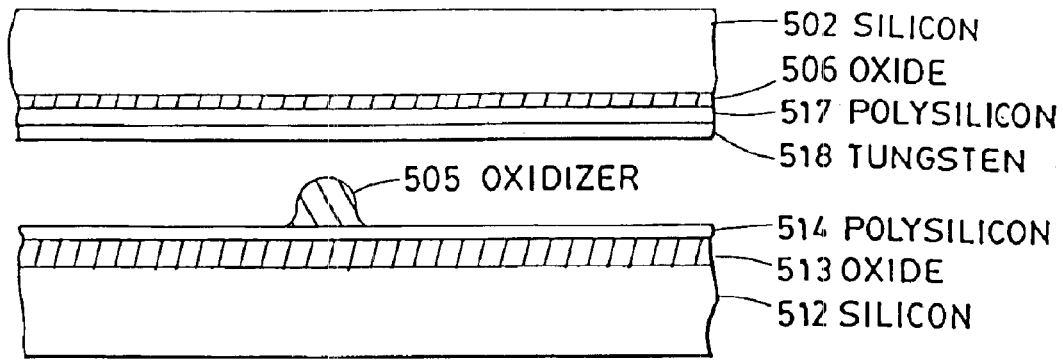
FIGS. 5a–b show in cross-sectional elevation views a third preferred embodiment of a wafer bonding method of the invention.
Figure 5B:
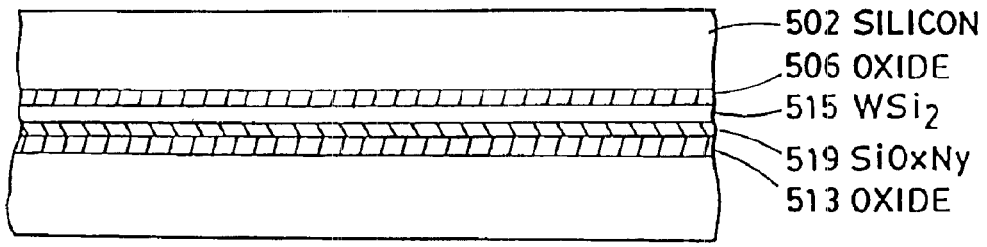

FIGS. 5a–b illustrate in cross-sectional elevation view a third preferred embodiment of the bonded wafer processing method of the invention.

(a) Begin with a six-inch diameter 600-μm thick silicon device wafer 502 and a comparable diameter 600-μm thick silicon handle wafer 512. Device wafer 502, which has the doping type and resistivity desired for eventual device fabrication, has a 500-angstrom thick thermal oxide layer 506, a 500-angstrom thick polysilicon layer 517, and a 1000-angstrom thick tungsten layer 518 on its bonding surface. Thermally oxidize handle wafer 512 to form oxide layer 513. Oxide 513 will become the bottom oxide, so the oxide is grown to the desired bottom oxide thickness, e.g., 2 μm. Deposit a 500-angstrom thick polysilicon layer 514 on oxide 513. The deposition of polysilicon may be by silane decomposition, the deposition of tungsten by sputtering. Place drop 505 of oxidizing aqueous bonding solution of $HNO_3$ and $H_2O_2$ on polysilicon 514; see FIG. 5a. Drop 505 consists of 20% by volume of a 67% $HNO_3$ solution and 80% by volume of a 30% $H_2O_2$ solution. Drop 505 has a volume of about 0.05 cc, corresponding to about 4.0 microliters per square inch of wafer surface, and theoretically will spread out to a layer with a thickness (if uniform) of 6 μm on polysilicon 514. Note that drop 505 wets the surface of polysilicon 514. A drop volume in the range of 4 to 10 microliters per square inch of wafer surface leads to good bonding.

(b) Press handle wafer 512 and device wafer 502 together with drop 505 of first preferred embodiment oxidizer on the surface of polysilicon 514. The pressed together wafers, after being allowed to dry for 24 hours, are heated to 900° C. in a 2–6 hour furnace cycle with an oxidizing ambient. This drives polysilicon 517 to react with tungsten 518 to form tungsten silicide, $WSi_2$, and drives oxidizer 505 to react with polysilicon 514 to form silicon oxynitrides ("nitrox"). The tungsten also reacts with the nitrox, thereby binding the wafers if polysilicon 514 is consumed. See FIG. 5b. The tungsten forms tungsten-silicon bonds, the nitrate forms both silicon-oxygen and silicon nitrogen bonds, and the water evaporates. The reactions basically are:

$$W + 2Si \rightarrow WSi_2$$

$$Si + HNO_3 + H_2O_2 \rightarrow Si_wO_xN_y + H_2O + O_2$$

The oxidize in drop 505 oxidizes the portion of polysilicon 514 not consumed by the silicidation. This creates a bonded zone with a mixture of nitrox 519 connecting bottom oxide 513 plus handle wafer 512 to silicide 515 plus oxide 506 and device wafer 502. Bonded zone nitrox 519 has a thickness of about 500–860 angstroms, and silicide layer 515 has a thickness of about 800–1000 angstroms. Of course, increasing the ratio of $HNO_3$ to $H_2O_2$ in oxidizer drop 505 will increase x and decrease y and somewhat increase the thickness of bonded zone nitrox 315; decreasing the ratio has a converse effect. If there is a shortage of polysilicon, then the oxidizer oxidizes the silicide:

$$WSi_2 + HNO_3 + H_2O_2 \rightarrow Si_wO_xN_y + W_zO_uN_v + H_2O + O_2$$

(c) After bonding, remove the bulk of device wafer 502 by grinding, lapping, and polishing to leave the desired device island thickness and fabricated devices, as with the first preferred embodiment. As with the second preferred embodiment, the silicide layer can be isolated under each silicon island and thereby form a buried resistor. The resistance of such resistors can be adjusted by varying the thickness of the polysilicon and tungsten (or other metal) layers in the initial wafers and/or the size of each of the device islands.

Method with Silicides

The fourth preferred embodiment method of bonded wafer processing follows the steps of any of the first three preferred embodiments but replaces the metal (platinum, cobalt, and tungsten) with a silicide (or metal plus silicide mixture) that can further react with silicon, for example, the reaction of TiSi and Si to form $TiSi_2$. Again, the buried dielectric can be, for example, diamond, nitride, nitrox, and multilayered.

Diamond Buried Dielectric

Figure 6:
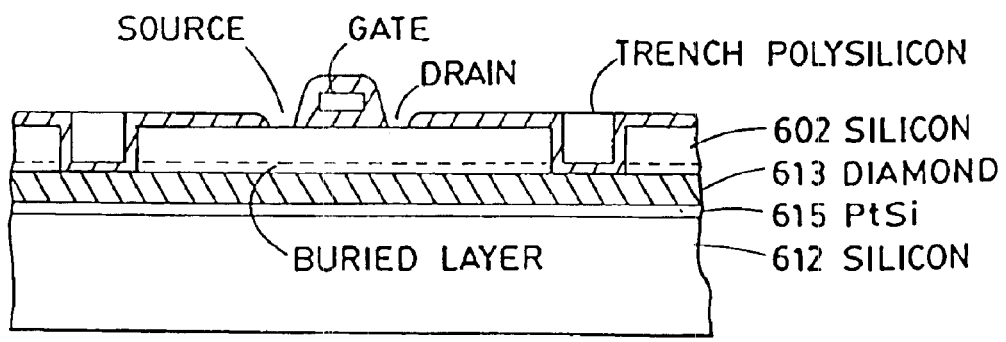
FIG. 6 is a cross-sectional elevation view of a bonded wafer with diamond buried dielectric in accordance with the present invention.

FIG. 6 shows a cross-sectional elevation view of a buried diamond structure in which device wafer 602 has diamond film 613 grown, polysilicon then deposited on the diamond, and platinum deposited on the polysilicon. The polysilicon and the handle wafer silicon both react with the platinum to form PtSi 615 to bind the wafers at 500° C., as in the first preferred embodiment. Diamond 613 requires low temperature bonding in order to avoid warpage, and the lack of any oxide layers provides high thermal conductivity from devices in device wafer 602 through diamond insulator 613 and bonding silicide 615 and into handle wafer 612. Diamond 613 and silicide 615 also provide lateral spreading of heat and limit hot spots in device wafer 602. The trench isolation in FIG. 6 includes deposited oxide, again to avoid high temperature processing of diamond film 613, and polysilicon filling the trench. Devices such as the illustrative field effect transistor can be situated over buried layers that are formed simply by introducing dopants prior to the growth of diamond film 613; these dopants do not excessively diffuse during processing because of the small thermal budget used with diamond films. As shown in FIG. 6, the buried layer of device wafer 602 abuts the diamond first dielectric layer 613.

Further Modifications and Variations

The preferred embodiments can be varied in many ways while retaining the feature of a silicidation reaction for bonding wafers. For example, metal and silicon, or other silicide precursors, can be on one of or both of the device and handle wafers that are brought together to be bonded. In addition, many different refractory metals form various silicides at various temperatures and with various temperature stability ranges. Thus, the type of dielectric and other materials involved and the processing steps to be used in device fabrication will determine thermal budgets and the choice of available silicides. For example, platinum is good for low temperature processing, whereas nickel and tungsten permit higher temperature processing. Also, some metals such as titanium, tantalum, and platinum easily dissolve or penetrate native oxides on wafer surfaces to form suicides, whereas cobalt is notorious for its resistance to silicidation in the presence of native oxides. Note that for many metals the metal migrates in the silicon to form silicides, but for tungsten the silicon migrates in the metal; this difference permits differing bonding zone reaction systems. Lastly, the metal can be chosen to minimize the differences between thermal coefficients of expansion of the silicide, dielectric, and wafers.

Device Characteristics

Devices and integrated circuits fabricated in silicon-on-insulator of the bonded wafers in accordance with the preferred embodiments of the present invention and then diced have the following beneficial properties:

(a) stress compensation due to incorporation of buried layers with closely matched thermal coefficients of expansion substrates and buried films (b) layers that can function as diffusion barriers to limit the diffusion of mobile contaminants (c) low temperature bonding that allows (i) dopants profiles in the device wafer from pre-bonding processing due to low thermal budgets of the silicidation bonding, and (ii) stress reduction and less warpage, especially for diamond dielectric (d) buried layers that are dielectrically isolated and able to function as resistor films (e) buried layers that can better dissipate thermal energy transferred through thermally conductive diamond films The invention has been described in detail for the purpose of illustration, but it is understood that such detail is solely for that purpose, and variations can be made therein by those skilled in the art without departing from the spirit and scope of the invention, which is defined by the following claims.

What is claimed:

1. A silicon-on-insulator integrated circuit, comprising:
    (a) a handle die;
    (b) a substantially continuous silicide layer over said handle die,
    (c) a substantially continuous first dielectric layer overlying one side of said silicide layer;

(d) a device silicon layer overlying said first dielectric layer, said device silicon layer having an upper surface;

(e) a second dielectric layer on said handle die underlying the opposite side of said silicide layer; and (f) interconnected transistors in and at the upper surface of said device silicon layer.

2. The integrated circuit of claim 1 wherein said silicide layer comprises a diffusion barrier to impurities.

3. The integrated circuit of claim 1 further comprising:

(g) trenches extending through said device silicon layer and separating said dice silicon layer into islands.

4. A silicon-on insulator integrated circuit comprising:

(a) a handle die;

(b) a first dielectric layer formed on said handle die (c) a substantially continuous silicide layer formed on said first dielectric layer, said silicide layer having a controlled resistance and providing a diffusion barrier to impurities;

(d) a substantially continuous second dielectric layer disposed between said silicide layer and a device silicon layer;

(e) trenches extending through said device silicon layer and silicide layer and separating said device silicon layer into islands each with an underlying continuous silicide area; and (f) interconnected transistors in and at an upper surface of said device silicon layer.

5. The integrated circuit of claim 4 further comprising:

(g) trenches extending through at least one of said islands to said underlying silicide area, said trenches having dielectric sidewalls and containing conductive material in contact with said silicide area.

6. The integrated circuit of claim 5 wherein said islands have a thickness no greater than about 2 $\mu$m, and said conductive material is tungsten.

* * * * *

UNITED STATES PATENT AND TRADEMARK OFFICE
CERTIFICATE OF CORRECTION

PATENT NO. : 6,909,146 B1  Page 1 of 1
APPLICATION NO. : 09/316580
DATED : June 21, 2005
INVENTOR(S) : Linn et al.

It is certified that error appears in the above-identified patent and that said Letters Patent is hereby corrected as shown below:

At Claim 3, Column 9, Line 11, please replace the first occurrence of "dice" with --device--

Signed and Sealed this

Twenty Second Day of April, 2008

JON W. DUDAS
*Director of the United States Patent and Trademark Office*